(12) United States Patent
Srivastava et al.

(10) Patent No.: US 7,037,846 B2
(45) Date of Patent: May 2, 2006

(54) METHOD AND APPARATUS FOR MICRO-JET ENABLED, LOW ENERGY ION GENERATION AND TRANSPORT IN PLASMA PROCESSING

(75) Inventors: Aseem Kumar Srivastava, Gaithersburg, MD (US); Herbert Harold Sawin, Chestnut Hill, MA (US); Palanikumaran Sakthievel, Gaithersburg, MD (US)

(73) Assignee: Axcelis Technologies, Inc., Beverly, MA (US)

( * ) Notice: Subject to any disclaimer, the term of this patent is extended or adjusted under 35 U.S.C. 154(b) by 270 days.

(21) Appl. No.: 10/752,906

(22) Filed: Jan. 6, 2004

(65) Prior Publication Data

US 2004/0140053 A1 Jul. 22, 2004

Related U.S. Application Data

(60) Division of application No. 09/905,043, filed on Jul. 31, 2001, now Pat. No. 6,761,796, which is a continuation-in-part of application No. 09/828,055, filed on Apr. 6, 2001, now abandoned.

(51) Int. Cl.
*H01L 21/302* (2006.01)
*H01L 21/461* (2006.01)

(52) U.S. Cl. ........................ 438/710; 438/711; 438/714
(58) Field of Classification Search .................... None
See application file for complete search history.

(56) References Cited

U.S. PATENT DOCUMENTS

| | | | | |
|---|---|---|---|---|
| 4,960,540 A | * | 10/1990 | Friel et al. ................... | 516/116 |
| 5,010,842 A | | 4/1991 | Oda et al. .................... | 118/723 |
| 5,593,540 A | * | 1/1997 | Tomita et al. ............... | 438/710 |
| 5,595,606 A | | 1/1997 | Fujikawa et al. ........... | 118/725 |
| 5,716,534 A | | 2/1998 | Tsuchiya et al. ............... | 216/67 |
| 5,788,778 A | | 8/1998 | Shang et al. .................... | 134/1 |
| 5,961,851 A | | 10/1999 | Kamarehi et al. ............. | 216/69 |
| 5,968,275 A | | 10/1999 | Lee et al. ............... | 118/723 R |
| 5,980,638 A | | 11/1999 | Janos ......................... | 118/715 |
| 5,997,962 A | * | 12/1999 | Ogasawara et al. .......... | 427/535 |
| 6,057,645 A | | 5/2000 | Srivastava et al. ...... | 315/111.21 |
| 6,082,374 A | | 7/2000 | Huffman et al. ............. | 134/1.1 |
| 6,093,281 A | | 7/2000 | Wise et al. ................. | 156/345 |
| 6,182,603 B1 | | 2/2001 | Shang et al. .......... | 118/723 ME |
| 6,203,657 B1 | | 3/2001 | Collison et al. ............. | 156/345 |
| 6,217,703 B1 | | 4/2001 | Kitagawa ..................... | 156/345 |
| 6,217,704 B1 | | 4/2001 | Kitagawa ..................... | 156/345 |
| 6,225,745 B1 | | 5/2001 | Srivastava ............. | 315/111.51 |
| 6,239,553 B1 | | 5/2001 | Barnes et al. ........... | 315/111.51 |
| 6,412,438 B1 | | 7/2002 | Kamarehi et al. ... | 118/723 ME |
| 6,432,255 B1 | | 8/2002 | Sun et al. .................... | 156/345 |
| 6,858,112 B1 | * | 2/2005 | Flamm et al. .......... | 156/345.48 |

* cited by examiner

*Primary Examiner*—Duy-Vu N. Deo
(74) *Attorney, Agent, or Firm*—Cantor Colburn LLP

(57) ABSTRACT

A method for creating and transporting low-energy ions for use in plasma processing of a semiconductor wafer is disclosed. In an exemplary embodiment of the invention, the method includes generating plasma from a gas species to produce a plasma exhaust. The plasma exhaust is then introduced into a processing chamber containing the wafer. The ion content of the plasma exhaust is enhanced by activating a supplemental ion source as the plasma is introduced into the processing chamber, thereby creating a primary plasma discharge therein. Then, the primary plasma discharge is directed into a baffle plate assembly, thereby creating a secondary plasma discharge exiting the baffle plate assembly. The strength of an electric field exerted on ions contained in the secondary plasma discharge is reduced. In so doing, the reduced strength of the electric field causes the ions to bombard the wafer at an energy insufficient to cause damage to semiconductor devices formed on the wafer.

11 Claims, 6 Drawing Sheets

METHOD AND APPARATUS FOR MICRO-JET ENABLED, LOW ENERGY ION GENERATION AND TRANSPORT IN PLASMA PROCESSING

CROSS-REFERENCE TO RELATED APPLICATIONS

The present application is a divisional application of application Ser. No. 09/905,043, filed Jul. 31, 2001, now U.S. Pat. No. 6,761,796, which is a continuation in part of application Ser. No. 09/828,055, filed on Apr. 6, 2001, now abandoned, the disclosures of which are incorporated by reference herein in their entirety.

BACKGROUND

The present invention relates generally to the plasma processing of semiconductor wafers and, more specifically, to a low-energy ion generation and transport mechanism for use in plasma ashing systems.

In the manufacture of integrated circuits, photolithography techniques are used to form integrated circuit patterns on a substrate. Typically, a semiconductor substrate is coated with a photoresist material, portions of which are exposed to ultraviolet (UV) radiation through a mask to image a desired circuit pattern on the photoresist. The portions of the photoresist left unexposed to the UV radiation are removed by a processing solution, leaving only the exposed portions on the substrate. In certain instances, these remaining exposed portions are baked using UV light during a photostabilization process to enable the photoresist to withstand subsequent processing.

After such processing, in which the integrated circuit components are formed, it is generally necessary to remove the remaining photoresist from the wafer. In addition, residue that may have been introduced on the substrate surface through processes such as etching must be removed. Typically, the photoresist is "ashed" or "burned" in the presence of atomic oxygen and other gases, and the ashed or burned photoresist, along with the residue, is "stripped" or "cleaned" from the surface of the substrate.

One manner of removing photoresist and residues is by directing a radio frequency (RF) energized or microwave-energized plasma at the substrate surface. In the case of a microwave-energized plasma, the plasma is formed by a gas mixture that is transported through a plasma tube that passes through a resonant microwave cavity. Microwave energy within the cavity is introduced into the plasma tube to excite the gas mixture therein and form a plasma. The exited plasma exhaust containing reactive species passes from the tube into a process chamber, in which resides a photoresist-coated semiconductor substrate to be ashed. This type of asher is known as a "downstream asher", where the resist coated substrate is physically removed from the plasma generator, which is known as an "upstream" plasma source.

In semiconductor applications where a relatively high dose of ion implantation has been imparted to a resist-coated wafer (e.g., $\geq 1\times 10^{15}$ cm$^{-2}$), the top layer of the photoresist turns into a highly carbonized crust which becomes impervious to the diffusion of trapped solvents from the remaining resist below. As a result, this crust must be carefully removed by the asher (generally at low wafer temperatures) in order to prevent the solvents from explosively exiting the crust. Otherwise, such a condition leads to the creation of "poppers" on the photoresist. The residue often left on the wafer surface by poppers is difficult to remove, and may be a potential source of contaminating particles on the wafer and within the tool chamber. A low temperature process relying solely upon the atomic species to chemically remove the crust, however, is inherently inefficient and compromises the asher's throughput (as measured by number of wafers processed per unit time).

A known method for enhancing the ash rate of the carbonized crust at low temperatures employs the use of ion bombardment. A conventional ion source in an asher uses a platen (or electrostatic chuck), which is typically biased at radio frequency (RF) by an RF source. Once activated, the RF source creates a capacitive discharge above the wafer. This secondary discharge then creates ion-electron pairs immediately above the wafer, from which ions are then accelerated by a capacitive "sheath" created above the wafer surface. Because the capacitive sheath may have an electric field potential as high as 40–50 eV or higher, the ions may strike the wafer at these high energies. However, such high-energy ion bombardment can cause extensive damage to the devices formed on the wafers. Also, the extensive heating of the wafer due to the heavy ion bombardment may lead to inconsistent wafer temperatures between wafer to wafer operations.

BRIEF SUMMARY

The previously discussed drawbacks and deficiencies of the prior art are overcome or alleviated by a method for creating and transporting low-energy ions for use in plasma processing of a semiconductor wafer. In an exemplary embodiment of the invention, the method includes generating plasma from a gas species to produce a plasma exhaust. The plasma exhaust is then introduced into a processing chamber containing the wafer. The ion content of the plasma exhaust is enhanced by activating a supplemental ion source as the plasma is introduced into the processing chamber, thereby creating a primary plasma discharge therein. Then, the primary plasma discharge is directed into a baffle plate assembly, where a secondary plasma discharge is created as the plasma exits the baffle plate assembly. The strength of the sheath potential exerted on ions contained in the secondary plasma discharge is reduced, the sheath potential resulting from the primary plasma discharge. The resulting reduced strength of the electric field accelerates the ions through a lower potential, thereby causing ion bombardment on the wafer at an energy insufficient to cause damage to semiconductor devices formed on the wafer.

In a preferred embodiment, the reduction of acceleration of ions through the sheath potential in the secondary plasma discharge is achieved by locating the supplemental ion source so as to have the baffle plate assembly disposed between the primary plasma discharge and the wafer. In addition, the baffle plate assembly is configured so as to cause the secondary plasma discharge to be shaped in substantially a micro-jet formation. The baffle plate assembly includes an upper baffle plate and a lower baffle plate, with said lower baffle plate further having a plurality of chamfered holes located therethrough, to provide uniform ion impingement on the surface of the wafer, thereby preventing charging effects from damaging the wafer.

BRIEF DESCRIPTION OF THE DRAWINGS

Referring to the exemplary drawings wherein like elements are numbered alike in the several Figures.

DETAILED DESCRIPTION

A novel low-energy ion generation and transport mechanism is disclosed herein; this mechanism enhances the chemical decomposition and subsequent volatilization of a carbonized top layer of an ion-implanted photoresist in a uniform manner, without also exposing the wafer to the potentially harmful effects of high-energy ion bombardment due to high sheath voltages. Such a "soft" ion assisted technique takes advantage of the synergy between the ions generated by a supplemental ion source in the ash tool and the chemical reactants already present, thereby producing a faster reaction than can be achieved by either, or the simple sum of these components.

It is believed that the ions contribute both "physical" kinetic energy, as well as "chemical" internal energy released upon reaction, thereby effectively lowering the activation energy for surface reactions. By shielding the wafer from the high sheath potentials characteristic of a conventional capacitive discharge, the ions are subjected to a substantially weaker electric field when passing through the sheath potential formed at the wafer. Thus, the ions strike the wafer at energies that are insufficient to do significant damage to the wafer devices, but still enable the ion-assisted chemical process of removing a carbonized crust formed on implanted photoresist. This scheme is also particularly suited for systems that do not need a wafer chuck for operation.

While ion implanted resist is mentioned here as an example of an application for soft ion bombardment, many other applications of such ion bombardment may be foreseen. This includes, but is not limited to removal of post etch residue, anisotropic resist removal, selective removal of photoresist in the presence of low-k material, anisotropic etch, etc.

Figure 1:
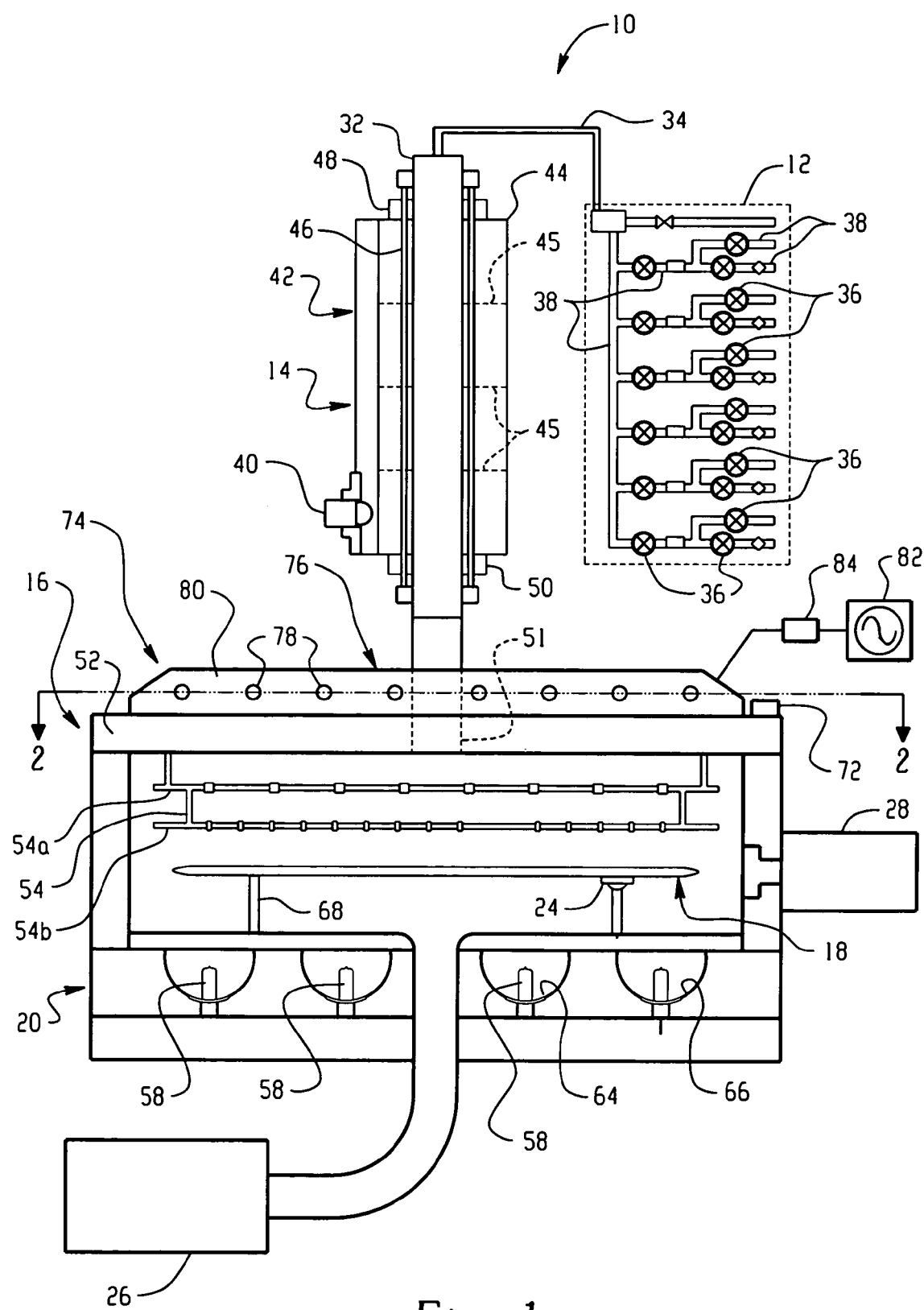
FIG. 1 is a schematical cross-sectional view of a plasma source and supplemental ion energizer which may be used with a process chamber of a photoresist asher.

Referring initially to FIG. 1, there is shown schematic of a photoresist asher 10, in accordance with an embodiment of the invention. Asher 10 includes a gas box 12, a microwave power generator assembly 14, a process chamber 16 in which is heated a semiconductor substrate or workpiece such as a wafer 18, and a radiant heater assembly 20 (for heating the wafer 18) situated at the bottom of the process chamber 16. A temperature probe 24, such as a thermocouple, is used to monitor the temperature of the wafer 18. A vacuum pump 26 is used to evacuate the process chamber 16 for processes requiring vacuum conditions. A monochromator 28 is used to monitor the optical emission characteristics of gases within the chamber to aid in process endpoint determination.

In operation, a desired mixture of gases is introduced into a plasma tube 32 from gas box 12 through an inlet conduit 34. The plasma tube 32 is made of a material such as quartz or sapphire. The gases forming the desired mixture are stored in separate supplies (not shown) and mixed in the gas box 12 by means of valves 36 and piping 38. One example of a desired gas mixture is nitrogen-based forming gas (primarily nitrogen with a small percentage of hydrogen) with or without oxygen. Optionally, a fluorine containing gas such as carbon tetrafluoride may be added to the gas mixture to improve ashing rates for certain processes. In such a case, sapphire is a preferred material for plasma tube 32. Sapphire resists the etching of the inner surface of plasma tube 32, caused by the presence of reactive fluorine atoms and ions in the plasma. Additional details regarding the use of sapphire in fluorine assisted stripping may be found in U.S. Pat. No. 6,082,374 to Huffman, et al., the contents of which are incorporated herein by reference.

The desired gas mixture is energized by the microwave power generator assembly 14 to form a reactive plasma that will ash photoresist on the wafer 18 in the process chamber 16 when heated by the radiant heater assembly 20. A magnetron 40 generates microwave energy (at about 2.45 GHz) which is coupled to a waveguide 42. The microwave energy is then fed from the waveguide through apertures (not shown) in a microwave enclosure 44, which surrounds the plasma tube 32. As an alternative to microwave energy, the desired gas mixture may be energized by a radio frequency (RF) power source (not shown) in place of magnetron 40, as is known in the art.

In the embodiment shown in FIG. 1, the plasma tube 32 is made of alumina (Al2O3) or single crystal sapphire to accommodate fluorine plasma chemistries. An outer quartz cooling tube 46 surrounds the sapphire plasma tube 32, and is slightly separated therefrom. Pressurized air is fed into the gap between the tubes 32 and 46 to effectively cool the plasma tube 32 during operation. The microwave enclosure 44 is segmented into sections shown by phantom lines 45. Segmentation of the enclosure 44 allows uniform microwave power distribution across the length of the tube 32, and protects it from overheating by preventing an unacceptably large thermal gradient from developing along its axial length when suitable input power is provided. Unlike quartz, sapphire is inclined to crack when heated unevenly. Thus, each segment of the enclosure 44 is separately fed with microwave energy that passes through the quartz tube 46 and the sapphire plasma tube 32 passing therethrough. Additional details regarding this enclosure maybe found in U.S. Pat. No. 5,961,851 to Kamarehi, et al., the contents of which are incorporated herein by reference. Alternatively, a microwave applicator with a single resonant cavity specially designed to resonate in the TM012 mode may be used. Additional details regarding such an applicator may be found in U.S. Pat. No. 6,057,645 to Srivastava, et al., the contents of which are incorporated herein by reference.

Regardless of the material used for plasma tube 32 (quartz or sapphire) or the type of microwave applicator, the gas mixture within the plasma tube 32 is energized to create a plasma. Microwave traps 48 and 50 are provided at the ends of the microwave enclosure 44 to prevent microwave leakage.

As stated previously, a conventional downstream asher deliberately generates a plasma upstream from the substrate, such that the "afterglow" plasma impinging on the substrate is rich in reactive atomic species but has a poor concentration of ions. A supplemental ion source 74, therefore, generates another plasma closer to the substrate having a substantial ionized content impinging on the surface of the wafer. The supplemental ion source 74 may be independently operable from the plasma generated by microwave power generator assembly 14 to accommodate different plasma characteristic requirements (e.g., low ion content or high ion content) within separate steps of a single process. It will be further appreciated that the supplemental ion source 74 may be incorporated into any type of upstream plasma based asher.

Figure 2:
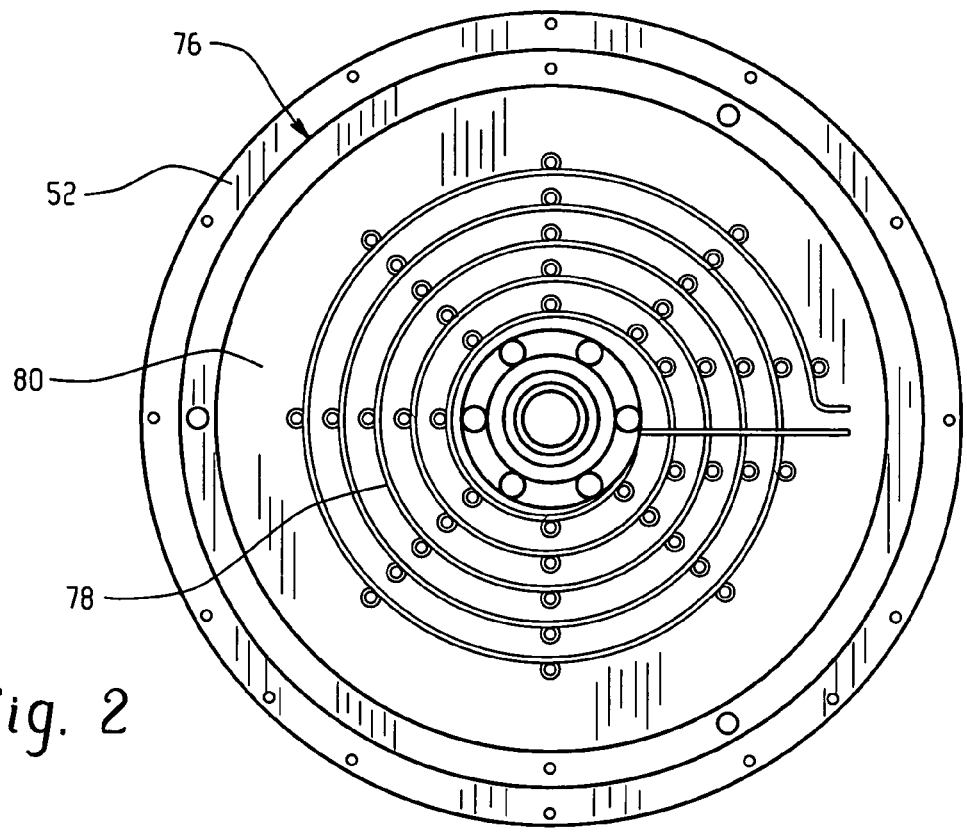
FIG. 2 is a cross-sectional view of the supplemental ion energizer of shown in FIG. 1, taken along the line 2—2.

In the embodiment shown in FIG. 1, the supplemental ion source 74 is provided in the form of a coil antenna assembly 76 located between a dielectric window 52 and the plasma tube 32. Alternatively, a planar antenna can be used. The dielectric window 52 in asher 10 is made of quartz or a similar dielectric material (like the ceramic alumina Al2O3) so that the signal emitted by coil antenna assembly 76 may pass therethrough and into the process chamber 16. As best seen in FIG. 2, the coil antenna assembly 76 has a metallic (e.g., copper) coil antenna 78 embedded within a base 80. The base 80 is preferably made of a fluoropolymer resin such as polytetrafluoroethylene (PFTE), more commonly referred to as Teflon®. Teflon® is a registered trademark of E.I. du Pont de Nemours and Company.

The coil antenna 78 should preferably reside outside of the process chamber 16 so that there is no contact with the energetic plasma, and no resulting particulate or sputtered metal contamination problem. The coil antenna 78, which is generally planar in shape, is also sufficiently large so as to cover the entirety (or substantially the entirety) of wafer 18.

The antenna 78 is energized by an RF signal output from RF signal generator 82. In a preferred embodiment, the RF signal operates at 13.56 megahertz (MHz). However, the operating frequency may be any radio frequency that is permitted within the ISM bands. Disposed between the RF signal generator 87 and the antenna 78 is a matching network 84 that minimizes reflected power from the antenna 78 back into the RF generator 82. The connections between the RF generator 82 and the matching network 84, as well as between the matching network 84 and antenna 78, may be made with coaxial cables or waveguides. Alternatively, other mechanisms of energizing the coil may be used, such as a self-contained, frequency-tuned RF generator and amplifier.

Figure 3:
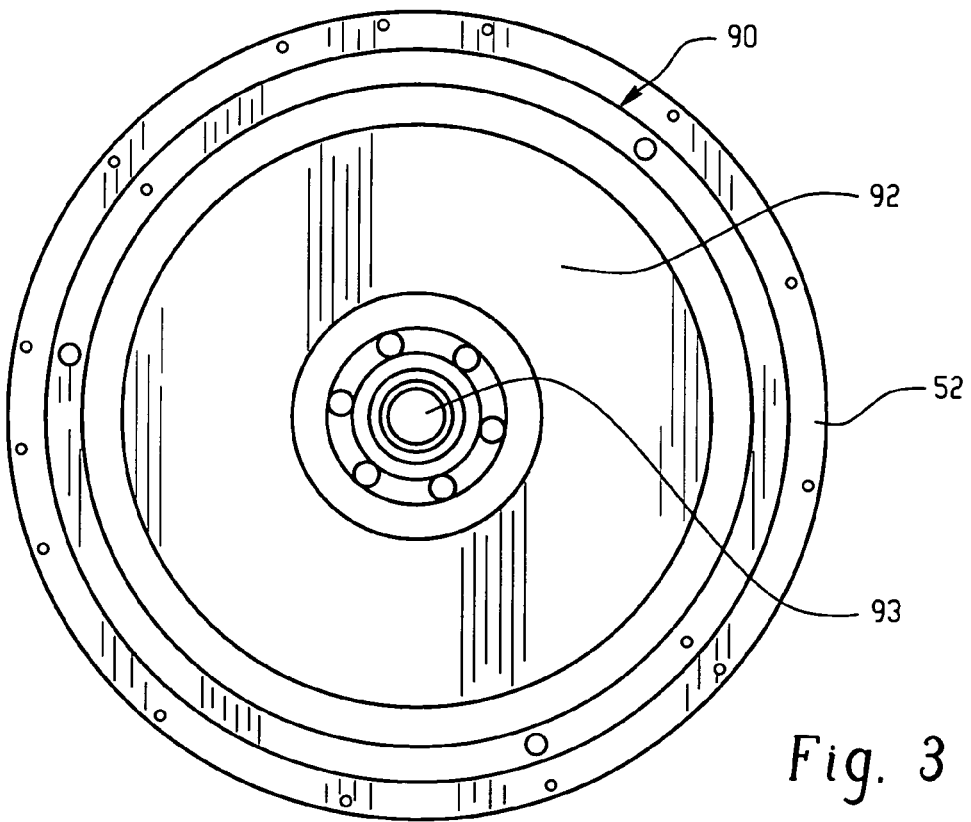
FIG. 3 is a cross-sectional view of an alternative embodiment of the supplemental ion energizer in FIG. 2.

FIG. 3 illustrates an alternative embodiment of the supplemental ion source 74, which is provided in the form of a plate antenna assembly 90. The plate antenna assembly 90 has a metallic (e.g., copper or aluminum) plate antenna 92 that is generally circular in shape, and is provided with a central aperture 93 for alignment with plasma tube 32. The plate antenna 92, which is also generally planar in shape, is again sufficiently large to cover the entirety (or substantially the entirety) of wafer 18. The resulting plasma discharge supplemented by antenna assembly 90 is primarily capacitive in nature, whereas the plasma discharge supplemented by antenna assembly 76 is partially inductive.

It will be appreciated that although FIG. 1 shows the use of an RF source for the supplemental energizer, the use of other energizing (e.g., microwave) sources is contemplated for the supplemental ion energizer 74.

Referring again to FIG. 1, after passing through supplemental ion source 74, the energized plasma enters the process chamber 16 through an opening 51 in the dielectric window 52. An apertured, dual-layered baffle plate assembly 54, comprised of upper baffle plate 54a and lower baffle plate 54b, evenly distributes the reactive plasma across the surface of the wafer 18 being processed. The radiant heater assembly 20 comprises a plurality of tungsten halogen lamps 58 residing in a reflector 64 that reflects and redirects the heat generated by the lamps toward the backside of the wafer 18 positioned within the process chamber 16 on quartz pins 68. The thermocouple 24, being in close contact with the wafer 18, provides a feedback loop to lamps 58, such that active temperature control of the wafer 18 may be maintained. One or more temperature sensors 72, such as thermocouples, are mounted on the exterior of dielectric window 52 to provide an indication of chamber temperature.

Figure 4:
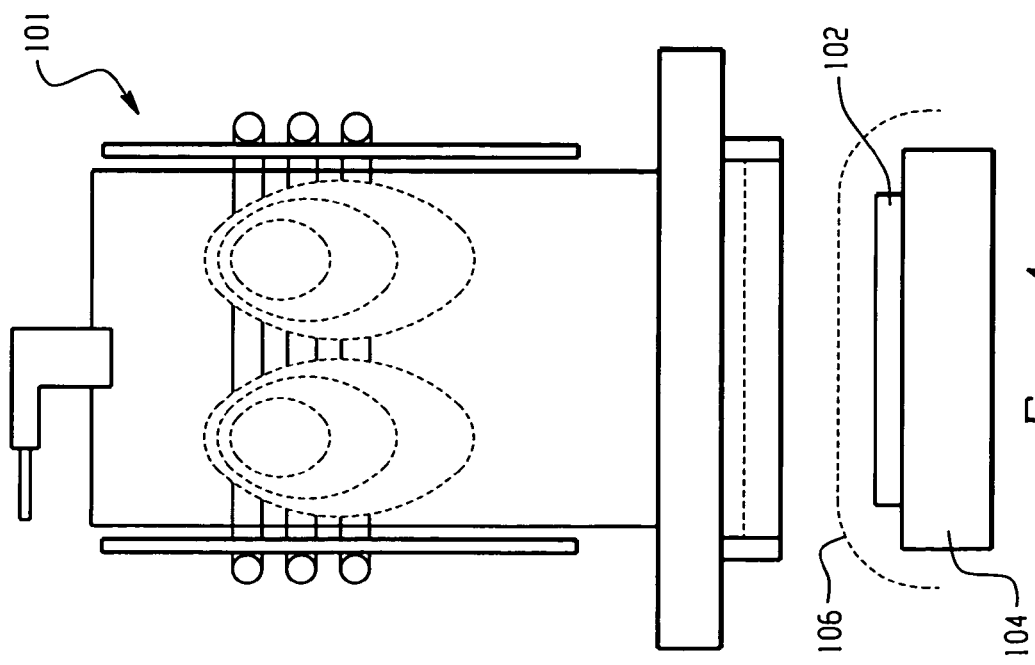
FIG. 4 illustrates a conventional plasma ashing system having a supplemental ion source, and a high-energy capacitive sheath created directly above a semiconductor wafer when an RF biased electrostatic chuck is activated to generate the ions.
Figure 6:
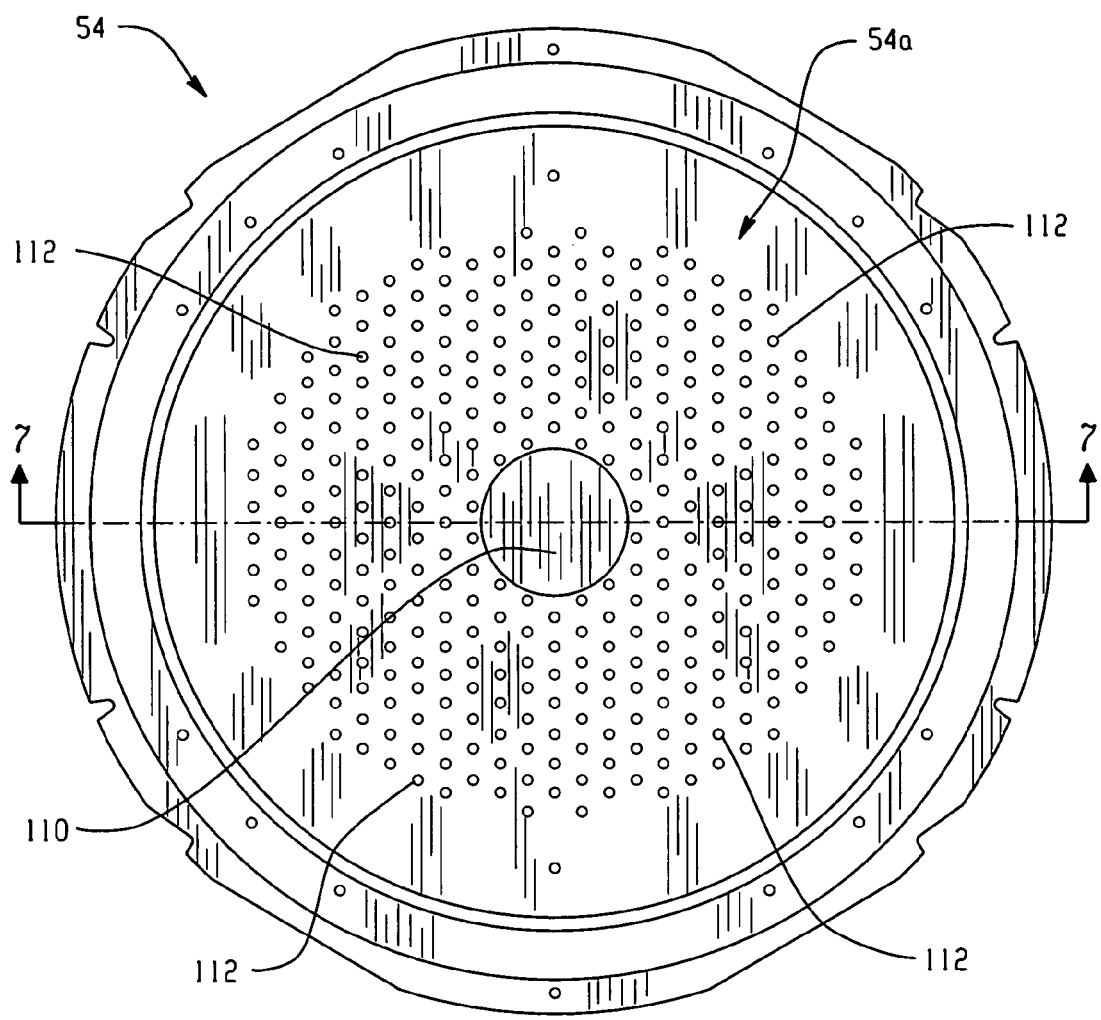
FIG. 6 is a top view of a baffle plate assembly in accordance with an embodiment of the invention.

In a conventional supplemental energizer of a typical plasma asher 101, the semiconductor wafer 102 is typically secured upon a chuck 104, as shown in FIG. 4. When ion bombardment is needed, the chuck 104 is typically biased at a certain RF potential (in order to provide supplemental ion generation), and a capacitive plasma is created directly above the wafer 102. The wafer 102 and chuck 104 are then enveloped in an energetic capacitive sheath 106. This energetic sheath 106 elevates the plasma to a positive potential relative to the wafer, and hence the ions (that are mostly positively charged having lost one or more electrons) are then attracted to the surface of wafer 102. The potential of the sheath 106 is the mechanism by which the ions are accelerated at high energy and thus bombard the wafer 102.

Figure 5:
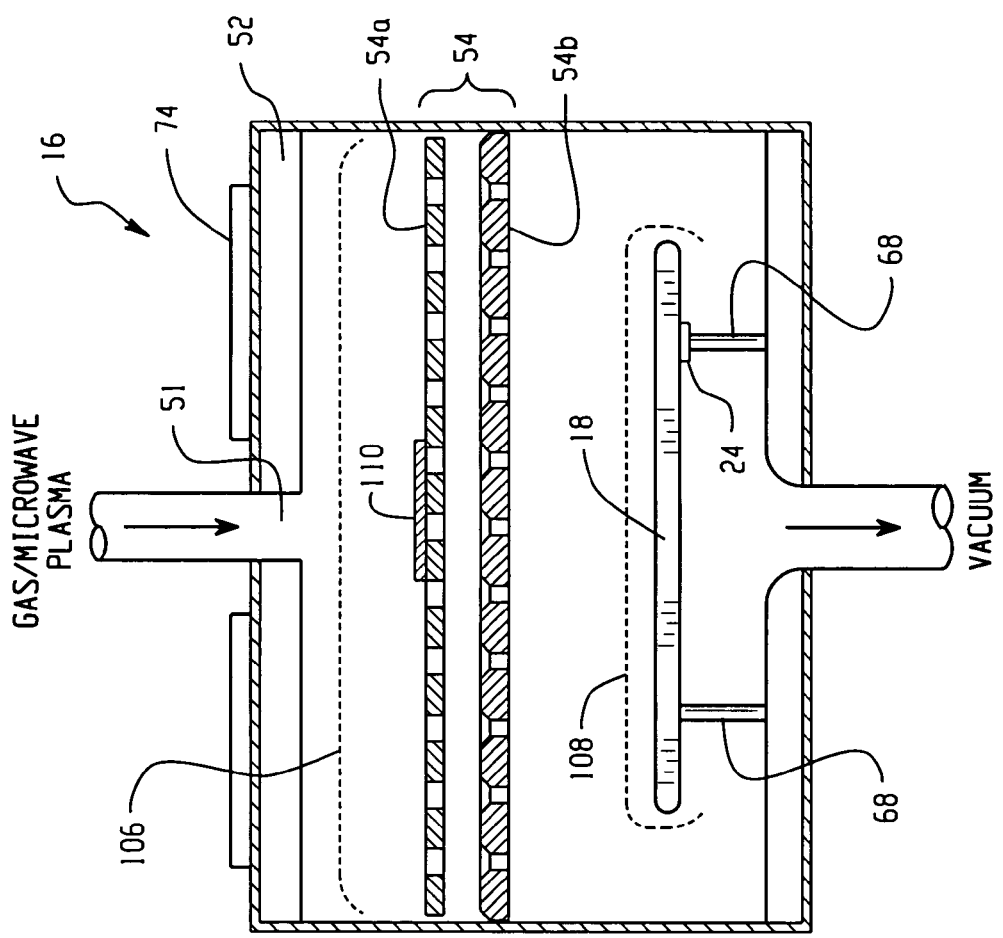
FIG. 5 is a cross-sectional schematic of the process chamber of FIG. 1, illustrating the isolation of the high-energy capacitive sheath from the semiconductor wafer, in accordance with an embodiment of the invention.

In contrast, the present invention embodiments allow the wafer to be protected from the formation of a high-energy sheath. In addition, a dense plasma is formed near the wafer. Referring now to FIG. 5, there is shown a cross-sectional schematic of the process chamber 16, illustrating the capacitive sheath created during the plasma process. The wafer 18, being mounted on quartz pins 68 (and thermocouple 24), is not biased at RF potentials. Once the microwave-energized plasma (or input gas, if the microwave plasma is not being operated) enters the process chamber 16 through an opening 51, the RF antenna 74 ignites an energetic capacitive (or a combination of inductive and capacitive) discharge with its associated energetic sheath 106. However, unlike a conventional process chamber, the sheath 106 (created due to the primary RF discharge) is located on the opposite side of baffle plate assembly 54 as the wafer 18. Thus, wafer 18 is not subjected to high-energy ions accelerated by energetic sheath 106. Instead, the ions diffuse to the wafer 18 and impact the wafer 18 with a maximum energy associated with a "floating potential" sheath 108 surrounding wafer 18. It should be noted that neither the sheaths formed between the baffle plates in baffle plate assembly 54 (and the holes therein), nor the plasma are shown in FIG. 5.

Figure 7:
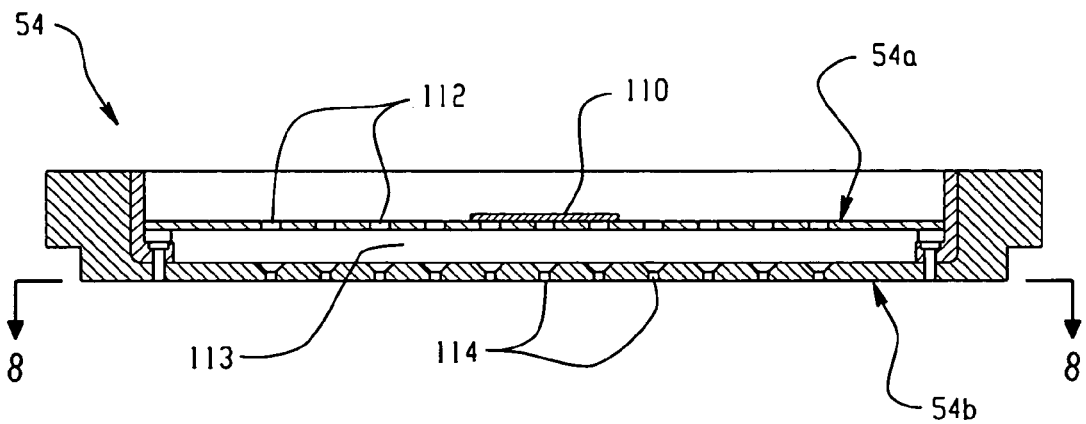
FIG. 7 is a side cross-sectional view of the baffle plate assembly shown in FIG. 6, taken along the line 7—7.

Referring generally now to FIGS. 6 through 10, there is shown the detailed baffle plate assembly 54 in accordance with another aspect of the present invention. Again, baffle plate assembly 54 includes the upper baffle plate 54a, made from a dielectric material such as quartz or ceramic. The upper baffle plate 54a may also be coated with sapphire so as to make it resistive to fluorine related etching. As shown in the top view of FIG. 6, upper baffle plate 54a has an impingement disk 110 disposed at the center thereof. The impingement disk 110 causes the primary plasma discharge to impinge thereupon and stream through openings 112 in the upper baffle plate 54a and into an interior plenum 113 in a uniform manner, as seen in FIG. 7. Baffle plate assembly 54 further includes a lower baffle plate 54b, preferably made from a material such as anodized aluminum, and is grounded to act as the opposing capacitive electrode to antenna 78 or 92. Lower baffle plate 54b also has a plurality of holes 114 therein, through which a secondary plasma discharge exits. The holes 114 in lower baffle plate 54b are preferably equivalent in number with the openings 112 in upper baffle plate 54a, and are spatially aligned with respect to one another.

Figure 8:
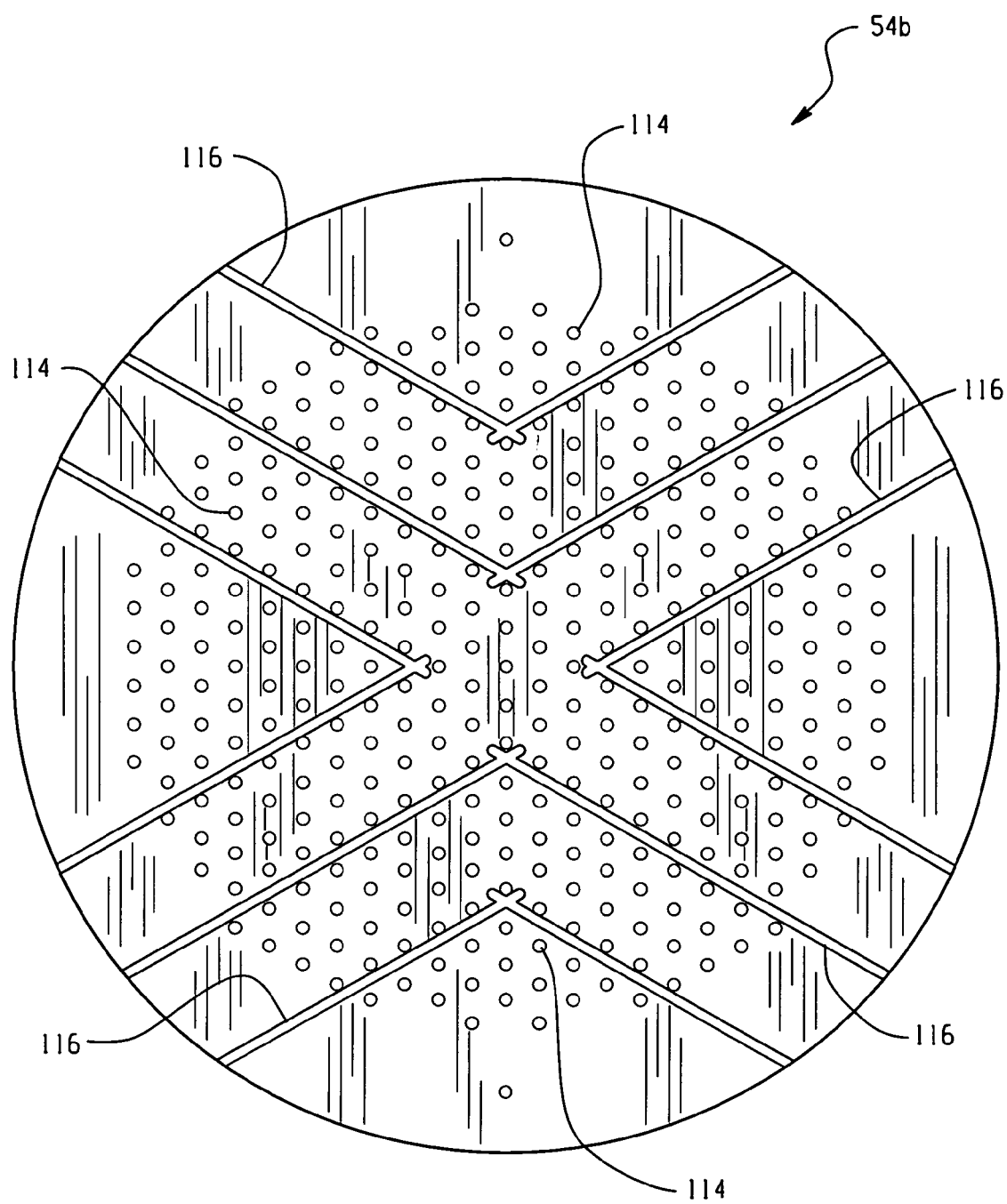
FIG. 8 is a top cross-sectional view of the lower baffle plate of the baffle plate assembly, taken along the line 8—8.

As shown more particularly in FIG. 8, a series of channels or grooves 116 run in a generally V-shaped configuration through the lower baffle plate 54b and in between the holes 114. The channels 116 provide a cooling mechanism for baffle plate assembly 54 by the circulation of water or other coolant material therethrough. It will be noted that the channels 116 and holes 114 are configured so as to prevent any channel 116 from being punctured and causing leaks.

Figure 9:
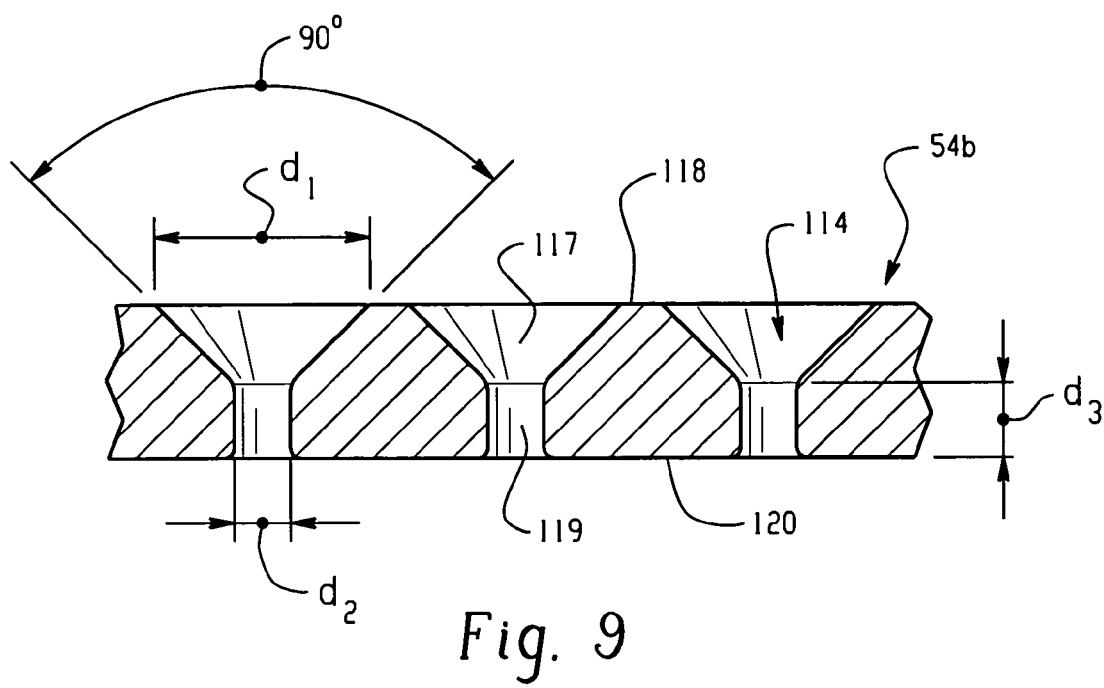
FIG. 9 is a cross-sectional, detailed view of the chamfered holes of the lower baffle plate.

Referring now to FIG. 9, there is illustrated a detailed cross-sectional drawing of the lower baffle plate holes 114. Each hole 114 has a first diameter d1 on an inner surface 118 (or plenum side) of lower baffle plate 54b and a second diameter d2 on an outer surface 120 (or wafer side) of lower baffle plate 54b. The first diameter d1 is larger than the second diameter d2. As can be seen, the plenum side of the holes 114 are generally frustoconical in shape, being tapered inward by a 90 degree chamfer until the interior diameter thereof is equal to d2. This occurs roughly halfway through the thickness of the lower baffle plate 54b, and thus holes 114 may be characterized as having both a frustoconical section 117 and a cylindrical section 119. The cylindrical section 119 of hole 114 has a height represented by d3 in FIG. 9.

Figure 10:
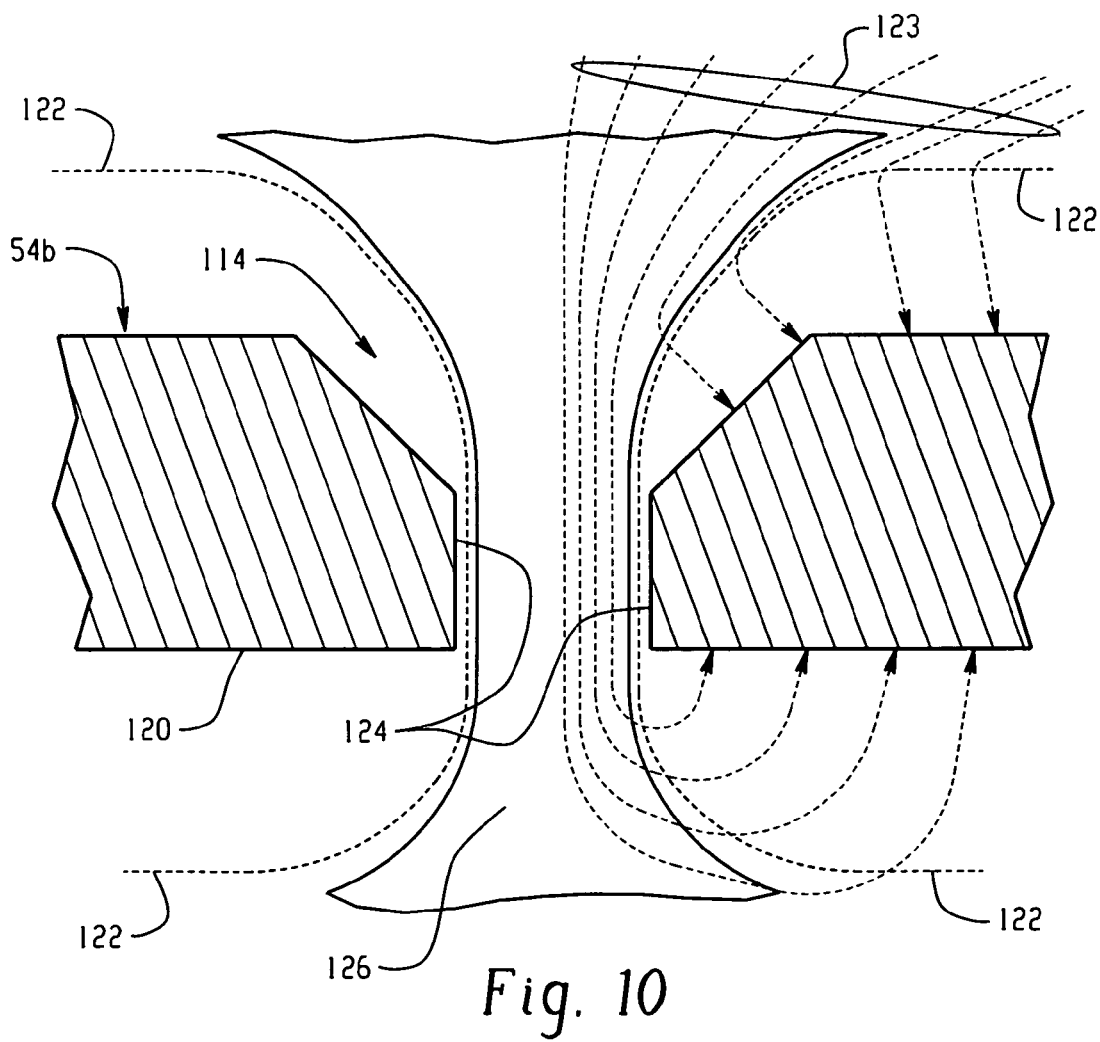
FIG. 10 is a schematic illustrating the micro-jet, low-energy ion formation through the chamfered holes of the lower baffle plate.

Finally, FIG. 10 illustrates the micro-jet, low-energy ion generation region through the chamfered holes 114 of the lower baffle plate 54b. As a result of the primary plasma discharge in the plenum above the baffles, a local sheath 122 is created in the holes 114, thereby resulting in an electric field. Electrons and ions from the primary discharge enter the holes 114 and create a current path (indicated by dashed arrows 123) through each hole and to the outer surface 120 of the lower baffle plate 54b. As the current lines (arrows 123) converge approaching the holes 114, the current density increases causing the formation of a denser plasma in the hole, thereby forming the plasma jet which has a narrow plasma sheath. The increased plasma density of the microjet may also increase the neutral temperature which reduces the density of neutrals in the holes. The combination of these effects may increase the electron temperature and change the chemistry of the discharge in the micro-jet. In addition, the ions are also accelerated by the sheath and strike the inner surface 124 of the holes 114, thereby ejecting secondary electrons. The narrower sheaths associated with high plasma density permit the acceleration of the electrons across the sheath 122 with few collisions resulting in the creation of very energetic electrons in the micro-jet. The secondary electrons gain enough energy so as to collide with neutral gas molecules, thereby ionizing them and creating a micro-jet shaped discharge 126 through the holes.

The formation of micro-jets in the grounded baffle plate 54b has the unique property of increasing the plasma density near the larger area electrode. In conventional capacitively coupled discharges, the plasma density is highest at the smaller electrodes because of the higher electric fields and greater RF current density at the smaller electrode, this smaller electrode being where the wafer resides. The use of the perforated lower baffle plate 54b as an electrode with holes therein that facilitate micro-jet formation increases the plasma density and power dissipation at the larger area electrode. The greater density decreases the plasma sheath thickness, thereby increasing the capacitance across the sheath and increasing the effective area ratio between the lower baffle plate 54b and the antenna 78 or 92. The increased area ratio decreases the ion bombardment energy of the baffle plate which minimizes the sputtering of the baffle plate and corresponding contamination of the wafer with sputtering products. At the same time, the increased plasma density in the region of the lower baffle plate 54b near the wafer and greater electron temperature increases both the ion bombardment flux of the wafer and can induce unique plasma chemistries. Thereby, surface reactions are possible on the wafer that could not have otherwise occurred without the micro-jets. This ion bombardment occurs in a uniform manner such that charging effects on the wafer are mitigated.

The micro-jet discharge 126 is the primary source of ions that ultimately impinge on the wafer. Because the wafer is biased at its floating potential (and not that of the RF capacitive-electrode sheath potential of the secondary discharge as in conventional ashers), the ions strike the wafer at energies insufficient to cause damage. In addition, it has also been empirically determined that a low aspect ratio (diameter d2 divided by height d3) of the holes 114 enhances the micro-jet discharge. However, if the height of the holes 114 (i.e., thickness of the lower baffle plate 54b) is made too small, the capacity for water cooling of the lower baffle plate is eliminated. On the other hand, if the diameter of a hole is made too large so as to lower the aspect ratio, the effectiveness of the baffle plate in uniformly dispersing the plasma discharge is diminished. Accordingly, the holes 114 of the present invention embodiment(s) are configured so as to provide a lower aspect ratio for effective generation and transport of an ion rich plasma, through the holes to the wafer, while still allowing effective baffle plate cooling.

The sizing and aspect ratio of the holes 114 needed to generate reliable micro-jets therein is a function of the process conditions, including parameters such as plasma power, pressure, gas composition, etc. In this process, the "lighting" of micro-jets in the holes 114 is required to achieve uniform processing. The process described achieves the uniform and reliable lighting of the micro-jets to produce such uniform processing. This differs from other applications, such as etch tunnels, in which a perforated plate with smaller holes that do not reliably form micro-jets is used to create a "field-free region" within the tunnel where wafers can be processed with minimal ion bombardment. Similarly, the present invention embodiments differ from other prior art wherein a perforated plate with larger holes is used to make a simple capacitive electrode in which the plasma passes through the holes in the plate without the formation of micro-jets.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method for creating and transporting low-energy ions for use in plasma processing of a semiconductor wafer, the method comprising:
   generating plasma from a gas species to produce a plasma exhaust for introduction into a processing chamber containing the wafer;
   enhancing the ion content of said plasma exhaust by activating a supplemental ion source, thereby creating a primary plasma discharge within said processing chamber;
   directing said primary plasma discharge into a baffle plate assembly; and
   generating a secondary plasma discharge from said baffle plate assembly, wherein ions in said secondary plasma discharge are subjected to an electric field determined by a floating potential of the wafer such that said ions are caused to bombard the wafer at an energy insufficient to cause damage to semiconductor devices formed on the wafer.

2. The method of claim 1, further comprising:
   generating a first plasma density proximate a first electrode; and
   generating a second plasma density proximate a second electrode;
   wherein said second plasma density is greater than said first plasma density, and said second electrode has a surface area greater than a surface area of said first electrode.

3. The method of claim 2, wherein said generating said second plasma density further comprises configuring said baffle plate assembly so as to cause said secondary plasma discharge to comprise a plurality of micro-jets.

4. The method of claim 3, wherein:
   said baffle plate assembly is configured to include an upper baffle plate and a lower baffle plate; and
   at least one of said upper and said lower baffle plates is further configured with a plurality of chamfered holes located therethrough.

5. The method of claim 4, wherein said chamfered holes further comprise a frustoconical section and a cylindrical section.

6. The method of claim 4, wherein said at least one of said upper and said lower baffle plates is configured to isolate the wafer from a sheath potential created by said primary plasma discharge.

7. The method of claim 4, further comprising configuring said at least one of said upper and said lower baffle plate as said second electrode.

8. The method of claim 4, wherein said at least one of said upper and said lower baffle plates comprises one of quartz, sapphire, ceramic or sapphire-coated quartz.

9. The method of claim 4, wherein said at least one of said upper and said lower baffle plates is comprised of a conductive material.

10. The method of claim 9, wherein said conductive material is coated with a dielectric and wherein said conductive material is grounded.

11. The method of claim 10, wherein said dielectric is anodized aluminum.

* * * * *